(12) United States Patent
Cortez

(10) Patent No.: US 8,975,909 B1
(45) Date of Patent: Mar. 10, 2015

(54) METHODS AND APPARATUS FOR REDUCING ELECTROSTATIC DISCHARGE DURING INTEGRATED CIRCUIT TESTING

(75) Inventor: Adrian Cortez, Redwood City, CA (US)

(73) Assignee: Altera Corporation, San Jose, CA (US)

( * ) Notice: Subject to any disclaimer, the term of this patent is extended or adjusted under 35 U.S.C. 154(b) by 283 days.

(21) Appl. No.: 13/560,921

(22) Filed: Jul. 27, 2012

(51) Int. Cl.
*G01R 31/00* (2006.01)
*G01R 1/067* (2006.01)
*G01R 31/20* (2006.01)

(52) U.S. Cl.
CPC ........ *G01R 1/06722* (2013.01); *G01R 1/06766* (2013.01)
USPC ..................................... 324/756.02; 324/754

(58) Field of Classification Search
CPC ........... G01R 1/06722; G01R 1/06766; G01R 1/07314; G01R 31/2884
USPC ................................ 324/158.1, 754, 761, 765
See application file for complete search history.

(56) References Cited

U.S. PATENT DOCUMENTS

| | | | |
|---|---|---|---|
| 5,461,327 A * | 10/1995 | Shibata et al. | 324/750.08 |
| 5,500,605 A | 3/1996 | Chang | |
| 6,541,988 B2 | 4/2003 | Dangelmayer et al. | |
| 7,082,676 B2 | 8/2006 | Ramirez et al. | |
| 7,256,595 B2 * | 8/2007 | Caldwell et al. | 324/756.02 |
| 7,728,613 B2 | 6/2010 | Blaney et al. | |
| 7,759,950 B2 | 7/2010 | Asano et al. | |
| 2005/0077913 A1 * | 4/2005 | Watkins et al. | 324/754 |
| 2006/0125500 A1 * | 6/2006 | Watkins et al. | 324/754 |
| 2006/0137171 A1 * | 6/2006 | Watkins et al. | 29/593 |
| 2006/0189189 A1 * | 8/2006 | Jeon | 439/248 |
| 2007/0024305 A1 * | 2/2007 | Kim | 324/761 |
| 2008/0116922 A1 * | 5/2008 | Blaney et al. | 324/760 |
| 2008/0150569 A1 * | 6/2008 | Barabi et al. | 324/761 |

* cited by examiner

*Primary Examiner* — Jermele M Hollington
*Assistant Examiner* — Raul Rios Russo

(57) ABSTRACT

A test structure operable to receive an integrated circuit is described. The test structure includes a substrate, a test contact member, a base structure, an aperture, and a conductive contact member. The test contact member extends from a surface of the substrate and has a tip at one end. The base structure is suspended above the surface of the substrate and has an aperture in which the test contact member is positioned. Furthermore, the conductive member is disposed in the aperture. The conductive member is positioned further away from the surface of the substrate compared to the tip of the test contact member. A method to test an integrated circuit (IC) utilizing the test contactor is also described.

25 Claims, 8 Drawing Sheets

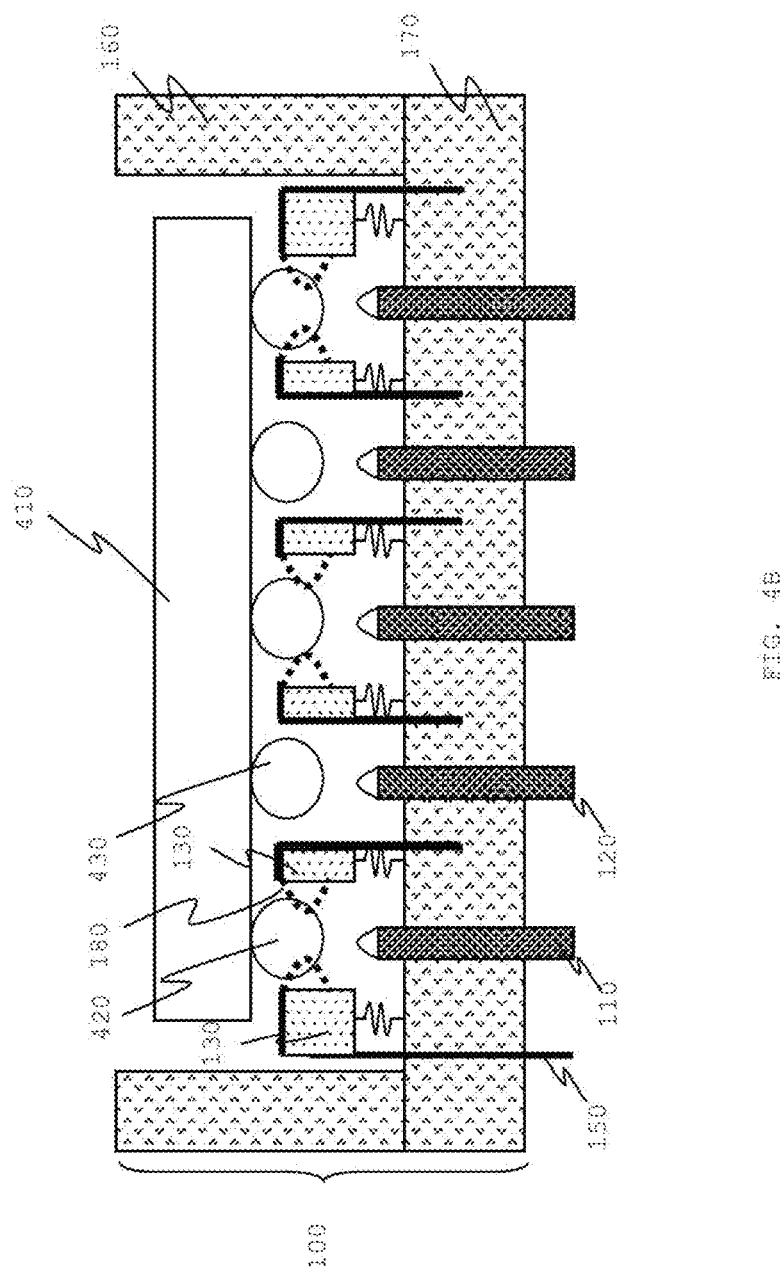

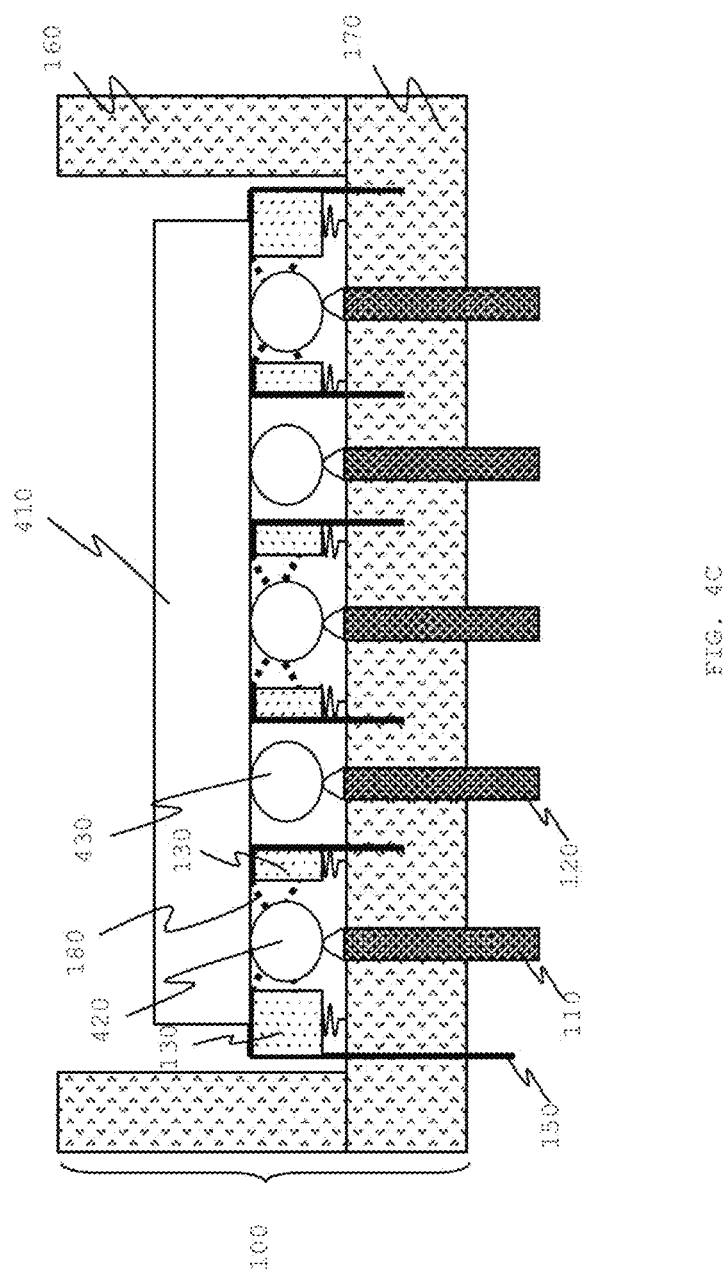

METHODS AND APPARATUS FOR REDUCING ELECTROSTATIC DISCHARGE DURING INTEGRATED CIRCUIT TESTING

BACKGROUND

Integrated circuits (ICs) are becoming significantly sensitive to electrostatic discharge (ESD) events due to advancements in operating speed and their ability to operate at low power. An ESD event can occur during manufacturing of the ICs, especially when the ICs are being tested. Furthermore, an ESD event may be difficult to prevent when sensitive test equipment is involved.

A particular concern is when a test contactor is first coupled to an IC through its test contacts. Electrostatic discharge may occur when the IC is electrically coupled to the test contactor and may damage circuitry in the IC. Generally, test contactors are unable to discharge the built-up static charges that may be present on the surface of the IC.

It is within this context that the embodiments described herein arise.

SUMMARY

Embodiments described herein include a test contactor and methods for testing an integrated circuit with the test contactor. It should be appreciated that the embodiments can be implemented in numerous ways, such as a process, an apparatus, a system, a device, or a method. Several embodiments are described below.

In one embodiment, a test contactor that is capable of preventing electrostatic (ESD) events is described. The test contactor may be used to discharge any existing static charge (e.g., built-up charge on the surface of the integrated circuit) to ground by providing a contact to ground pads and/or ground solder balls on the integrated circuit.

In one embodiment, a test structure operable to receive an integrated circuit is described. The test structure may include a substrate, a test contact member, a base structure, an aperture, and a conductive contact member. The test contact member extends from a surface of the substrate and has a tip at one end. The base structure is suspended above the surface of the substrate and has an aperture where the test contact member is positioned. Furthermore, the conductive member is disposed in the aperture. The conductive member is positioned further away from the surface of the substrate compared to the tip of the test contact.

In an alternative embodiment, another test contactor operable to receive an integrated circuit under test is described. The test contactor may include a substrate, a test contact, and a base. The substrate further includes a first and second surface. The test contact member protrudes from the first surface of the substrate. The base has a hole surrounding the test contact member. The base includes a conductive contact member at the peripheral edge of the hole. The integrated circuit under test makes contact with the conductive contact member before making contact with the test contact member when being mated with the test contactor.

In another embodiment, a test system is described. The test system may include an integrated circuit and a test socket. The integrated circuit has a first pad that is operable to receive a ground voltage level. The test socket may include a substrate, a test contact member and a base. The substrate includes a first surface and a second surface. The test contact member protrudes from the first surface of the substrate by a first distance. The base structure is suspended over the first surface by a distance larger than the first distance. Furthermore, the base structure has a through-hole that surrounds the test contact member.

In another embodiment, a method of testing an integrated circuit using a test contactor is disclosed. The test contactor for this method includes a substrate that has a recess, a test contact member formed within the substrate and a base suspended above the test contact member with the recess and having a hole. The method includes receiving the integrated circuit within the recess of the test contactor. The method further includes making contact with a conductive contact formed in the hole when the integrated circuit is electrically decoupled from the test contact member.

Further features of the invention, its nature and various advantages will be more apparent from the accompanying drawings and the following detailed description of the preferred embodiments.

BRIEF DESCRIPTION OF THE DRAWINGS

FIGS. 4A-4C show an integrated circuit being coupled to a test contactor in accordance with one embodiment of the present invention.

FIG. 5 is a top-down view of an integrated circuit coupled to a test contactor in accordance with one embodiment of the present invention.

DETAILED DESCRIPTION

The following embodiments describe a test contactor and a method of testing an integrated circuit with the test contactor. It will be obvious, however, to one skilled in the art, that the present exemplary embodiments may be practiced without some or all of these specific details. In other instances, well-known operations have not been described in detail in order not to unnecessarily obscure the present embodiments.

Figure 1:
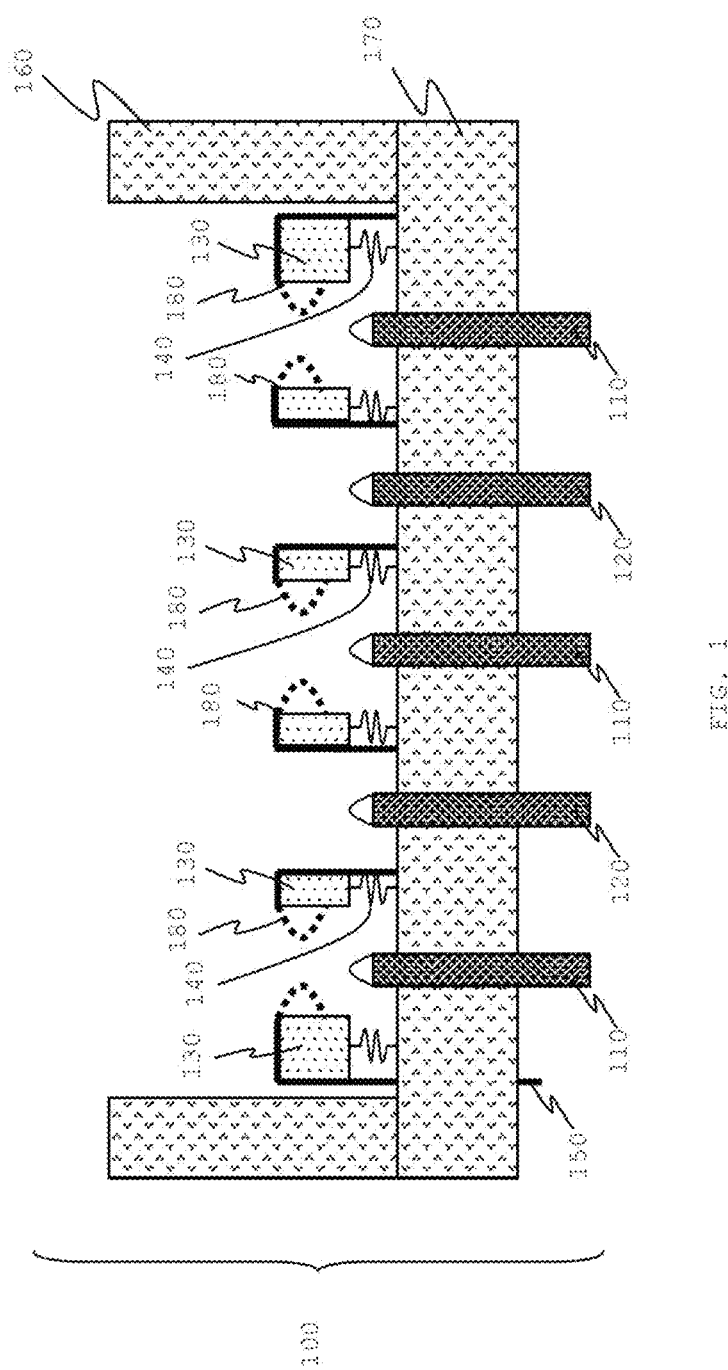
FIG. 1 shows a cross-sectional side view of an illustrative test contactor in accordance with an embodiment of the present invention.
Figure 3:
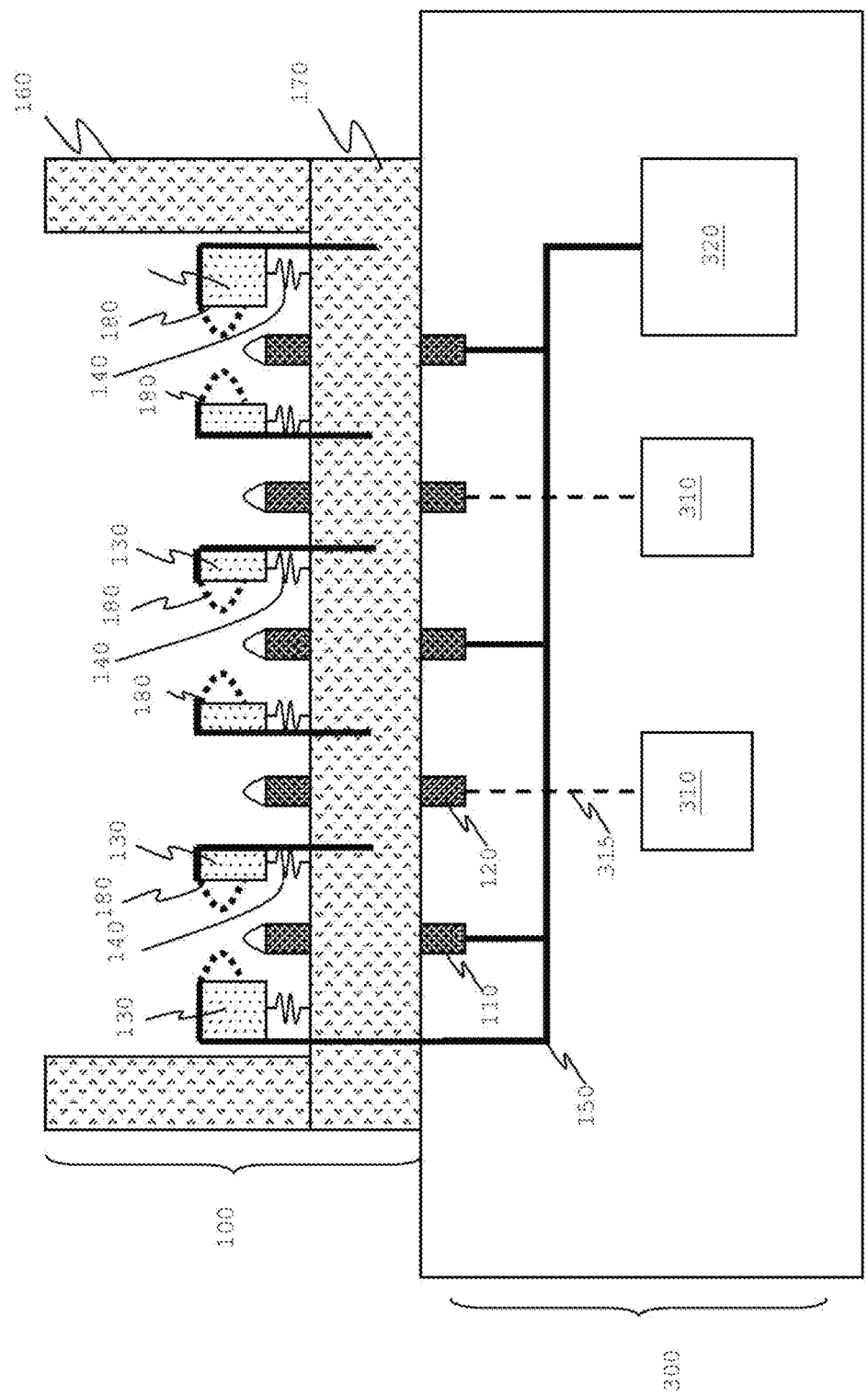
FIG. 3 shows a diagram of an illustrative test contactor that is coupled to test equipment in accordance with one embodiment of the present invention.

FIG. 1, meant to be illustrative and not limiting, illustrates a cross-sectional side view of test contactor 100 in accordance with one embodiment. Test contactor 100 may include substrate 170, test contacts 110 and 120 that may be inserted through substrate 170, spring members (or springs) 140, base structure 130 that may be suspended above substrate 170 using spring members 140, conductive pathways 150, cavity wall structure 160, and conductive contacts 180 that may be formed as part of base 130 and that may be coupled to pathways 150. Test contactor 100 may serve as a test socket for receiving a device under test (DUT) such as an integrated circuit (as an example). Furthermore, test contactor 100 may be coupled to a tester such as tester 300 as illustrated in the embodiment of FIG. 3.

As shown in FIG. 1, cavity wall structure 160 may be formed on substrate 170 and may surround base structure 130. Cavity wall 160 may serve as a physical guiding mechanism when receiving a DUT within test contactor 100. The DUT may be placed within the recess formed by cavity wall 160. In one embodiment, substrate 170 and cavity wall 160 may be formed using similar materials (e.g., ceramic, plastic, glass, or combinations of these materials).

In the example of FIG. 1, test contacts 110 and 120 are contact pins formed on test contactor 100 that provide interconnections between bump pads on an integrated circuit under test and external equipment. In an exemplary embodiment, test contacts 110 and 120 may convey input/output (I/O) signals, ground power supply voltage, and/or positive power supply voltage to the IC.

It should be appreciated that there may be other suitable configurations for test contacts 110 and 120. In the exemplary embodiment of FIG. 1, test contacts 110 and 120 are pogo pins. The pogo pins may include a tip on one end and a flat end on the other. It should be appreciated that the tips of the pogo pins may be coupled to solder balls/pads of an incoming IC (e.g., pogo pins 110 and 120 may make contact with input-output contacts of an integrated circuit under test). In an alternative embodiment, test contacts 110 and 120 may be cantilever pins, spring contacts, or other suitable coupling mechanisms.

Test contacts 110 and 120 may, for example, be arranged in an array on substrate 170. In one embodiment, test contacts 110 and 120 may be arranged or spaced apart such that they align with respective solder balls (or bump pads) on a device under test.

Still referring to FIG. 1, test contacts 110 and 120 may be partially embedded in substrate 170, with a first portion protruding from the upper surface of substrate 170 and another portion protruding from the bottom surface of substrate 170. Therefore, in one embodiment, only a portion of test contacts 110 and 120 (e.g., the tips of test contacts 110 and 120) is exposed at the upper surface of substrate 170. In another embodiment test contacts 110 and 120 may be cantilever pins and may be formed on the upper surface of substrate 170 instead of being embedded in substrate 170.

The tips of test contacts 110 and 120 may be surrounded by base 130. In the embodiment of FIG. 1, base 130 is suspended above the upper surface of substrate 170 by springs 140. Base 130 may be a planar structure that extends across the upper surface of substrate 170 (as shown in the illustrative embodiment of FIG. 2). In one embodiment, base 130 has apertures that are aligned with the respective tips of test contacts 110 and 120. In an alternative embodiment, base 130 may include island-like structures each of which surround a respective test contact. In one embodiment, base 130 may be composed of a nonconductive material (e.g., plastic).

Springs 140, which support base 130 above the upper surface of substrate 170, may serve to dampen the motion of an incoming IC. It should be appreciated that the spring constant of spring 140 may be sufficient to allow an IC to enter the cavity formed within test contactor 100 while sufficiently dampening the inward motion.

Springs 140 may be placed at a plurality of locations on the surface of substrate 170. In the exemplary embodiment of FIG. 1, springs 140 may be placed between two adjacent test contacts (e.g., test contacts 110 and 120). Springs 140 may be positioned so that force exerted by an incoming DUT is evenly distributed across the surface of substrate 170. In an alternative embodiment, springs 140 may be located at one portion of test contactor 100. When an IC is placed over base 130, springs 140 may be compressed when the IC is pressed down until solder balls/pads (sometimes referred to as IC input-output contacts) on the IC are coupled to respective test contacts 110 and 120. It should be appreciated that springs 140 extend perpendicularly from the upper surface of substrate 170. In one embodiment, the height of springs 140 at rest may be relatively close to the height of the respective test contacts 110 and 120 such that a bottom surface of base 130 is lifted just above the respective tips of test contacts 110 and 120. In an exemplary embodiment, the height of springs 140 at rest may be greater than 0.2 millimeter (mm).

In the embodiment of FIG. 1, base 130 may also include conductive contacts 180 that are disposed within respective apertures in base 130. The apertures in base 130 may sometimes be referred to as base through holes. In particular, conductive contacts 180 may be formed on the inner sides of the apertures in base 130 (e.g., contact members 180 may be formed at a peripheral edge of the respective apertures). Conductive contacts 180 may be coupled to electrical pathways 150. It should be appreciated that electrical pathways 150 and conductive contacts 180 may be composed of similar materials (e.g., copper, aluminum, silver, gold, and/or other suitable metals). When a DUT is placed in test contactor 100, bump pads or solder balls on the DUT may come into contact with conductive contacts 180 before the bump pads or solder balls make physical contact with test contacts 110 and 120.

Figure 2:
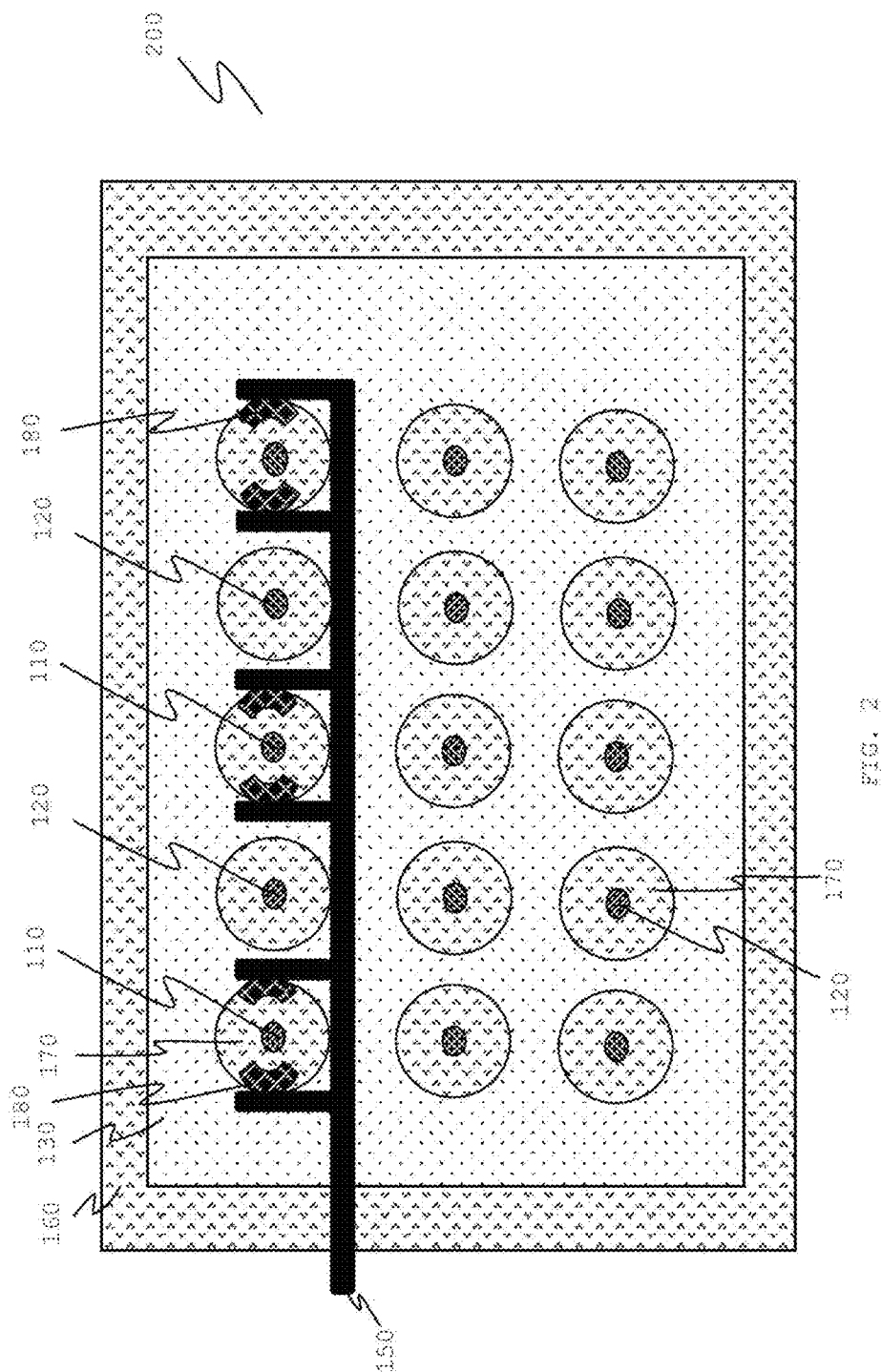
FIG. 2 shows a top view of an illustrative test contactor in accordance with one embodiment of the present invention.

FIG. 2, meant to be illustrative and not limiting, shows top-down view 200 of test contactor 100 in accordance with one embodiment. As shown in FIG. 2, an array of circular apertures may be formed in base 130. It should be appreciated that even though the circular apertures in the embodiment of FIG. 2 are shown arranged in an array of 3 rows and 5 columns, base 130 may include more or less than 15 apertures arranged in any desired configuration. The circular apertures may also be referred to as through-holes or openings in base 130. The position of each circular aperture in base 130 may correspond to a respective bump pad on an incoming DUT.

The circular apertures allow test contacts 110 and 120, which extend from the upper surface of substrate 160, to make contact with the solder balls/pads on the DUT. It should be appreciated that even though circular apertures are shown in the embodiment of FIG. 2, other polygonal shapes (e.g., squares, triangles, etc.) may be applicable in this context. The apertures are larger than the respective solder balls/pads of the incoming IC so that the solder balls/pads may be inserted through the apertures when contactor 100 receives the DUT. In one embodiment, the diameter of each aperture is approximately 1 mm. Test contacts 110 and 120 may be positioned at the center of the respective apertures, as shown in FIG. 2.

Electrical pathway 150 is partially laid on a surface of base 130, according to one embodiment. Electrical pathway 150 may be coupled to a power supply terminal (e.g., a positive power supply terminal or a ground power supply terminal) in an external power source. Electrical pathway 150 may be coupled to at least some of aperture contacts 180. In the embodiment of FIG. 2, electrical pathway 150 is only disposed along a single row of circular apertures. However, it should be appreciated that fewer or more electrical pathways 150 and conductive contacts 180 may be disposed on the surface of base 130 depending on the incoming IC. For example, if the incoming IC is sensitive to ESD events, more electrical pathways 150 and associated conductive contacts 180 may be formed in test contactor 100.

In one embodiment, conductive contacts 180 may be attached to the inner sides of the apertures. In the embodiment of FIG. 2, two conductive contacts 180 may be placed opposite each other on the inner sides of the respective apertures. However, it should be appreciated that other configurations may also be employed (e.g., conductive contacts 180 may be disposed differently). Apertures on base 130 allow solder balls/pads of an incoming IC to rest on test contacts 110 and 120 while base 130 may act as a support for the IC.

FIG. 3, meant to be illustrative and not limiting, illustrates test contactor 100 coupled to tester 300 in accordance with one embodiment. Test contactor 100 is placed on a surface of tester 300. In the embodiment of FIG. 3, test contactor 100 is placed on the upper surface of tester 300. The upper surface of tester 300 may be an interfacing surface. It should be appreciated that the interfacing surface of tester 300 may be utilized to couple with test sockets, probe cards, etc. The interfacing surface may include a plurality of cavity holes for test contacts, such as test contacts 110 and 120. The cavity holes may receive test contacts 110 and 120 when test contactor 100 is attached to tester 300.

Tester 300 further includes signal sources 310 and ground source 320. Signal sources 310 may be able to generate input/output (I/O) signals. In an exemplary embodiment, signal sources 310 may be signal generators/oscillators that are capable of generating high frequency I/O signals. Ground source 320 may be used to generate a ground voltage level. Ground source 320 may provide a reservoir for receiving unwanted electrostatic charge.

In the exemplary embodiment of FIG. 3, test contacts 110 are slotted into the respective cavity holes within the interfacing surface of tester 300. Test contacts 110 may be coupled to ground source 320 through electrical pathway 150 (e.g., test contacts 110 may provide ground voltage to solder balls/pads of an incoming IC). Furthermore, conductive contacts 180 may also be coupled to ground source 320 through electrical pathway 150. It should be appreciated that FIG. 3 shares similarities with FIG. 1 and as such, elements that have been described above (e.g., electrical pathway 150, test contacts 110 and conductive contacts 180, etc.) are not described in detail again.

Still referring to the embodiment of FIG. 3, test contacts 120 are inserted into the respective cavity holes formed within the interfacing surface of tester 300 and test contacts 120 are coupled to respective signal sources 310. Therefore, in one embodiment, test contacts 120 may provide I/O signals to the respective I/O pads or solder balls of an incoming IC.

Figure 4A:
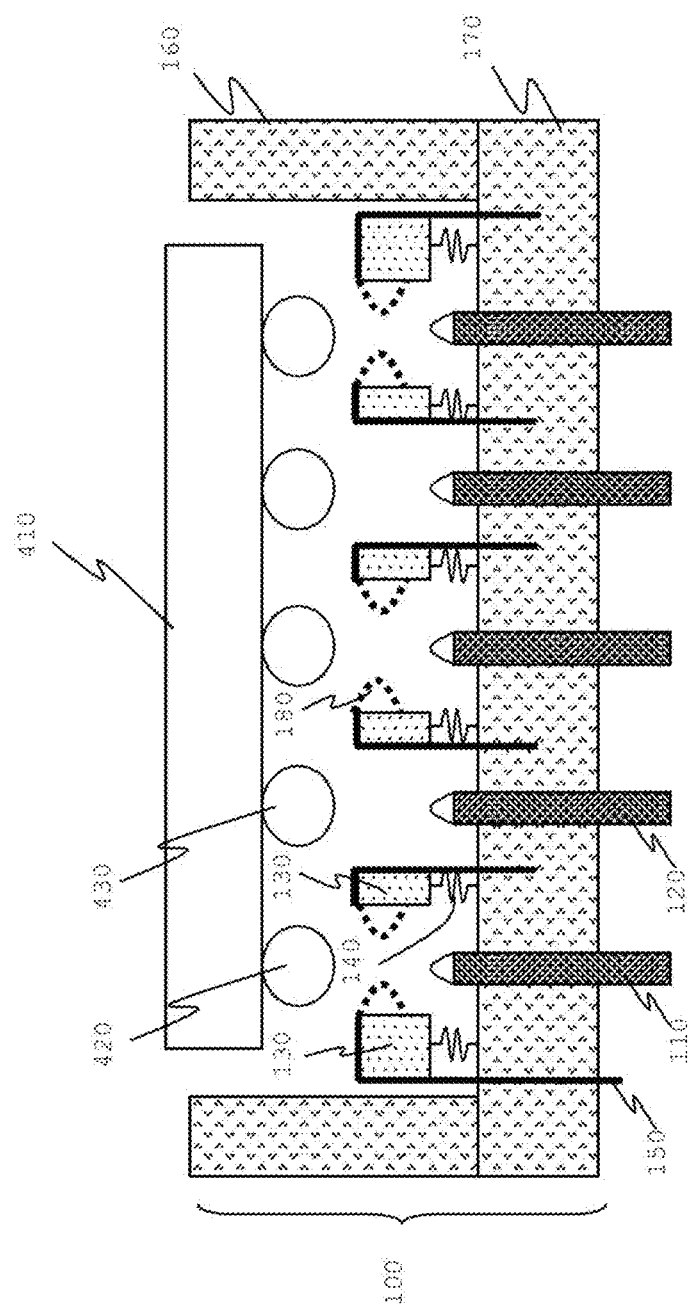

FIGS. 4A-4C, meant to be illustrative and not limiting, illustrate how test contactor 100 may come into contact with an incoming IC in accordance with one embodiment. The embodiments of FIGS. 4A-4C include test contactor 100 for receiving an incoming integrated circuit under test (CUT) 410. Test contactor 100, in FIGS. 4A-4C, may be placed on a tester (e.g., tester 300 of FIG. 3). It should be appreciated that test contactor 100 of FIGS. 4A-4C share similarities with test contactor 100 of FIG. 1. As such, for the sake of brevity, elements that have been described above will not be repeated in detail.

In one exemplary embodiment, device 410 may be a Field Programmable Gate Array (FPGA). Device 410 may include a plurality of contact pads or a plurality of solder balls. In the exemplary embodiments of FIGS. 4A-4C, device 410 includes a plurality of solder balls (e.g., solder balls 420 and 430). In one embodiment, solder balls 430 may be utilized to transfer I/O signals in and out of IC device 410 while solder balls 420 may be utilized to supply a ground voltage to IC device 410. In the embodiments of FIGS. 4A-4C, solder balls 430 may be configured to make contact with test contacts 120 and solder balls 420 may be coupled to the respective test contacts 110.

The movement of IC device 410 may be controlled by a test handler (not shown in FIGS. 4A-4C) in one embodiment. The test handler may rotate or move IC device 410 according to a test handler application. Furthermore, the test handler may also control the motion of IC device 410 when it is being pushed or pressed down towards base 130 and test contacts 110 and 120.

The embodiment of FIG. 4A shows IC device 410 being received within the cavity of test contactor 100. It should be appreciated that solder balls 420 and 430 may be smaller than the apertures on base 130 so that solder balls 420 and 430 may be inserted into the apertures and may make contact with test contacts 110 or 120 respectively. It should be appreciated that base 130 may have an aperture for every corresponding solder ball on IC device 410.

At this stage, there may be built-up charge on IC device 410 or test contactor 100. This charge may be accumulated due to friction generated during manufacturing (e.g., during packaging operations of ID 410) and subsequent handling of the integrated circuit package. Typically, the built-up charge is located on solder balls 420 and 430.

FIG. 4B illustrates solder balls 420 of IC device 410 being coupled to conductive contacts 180. At this stage, built-up charge on solder balls 420 may be discharged to ground 320. The built-up charge may be discharged through conductive contacts 180. It should be appreciated that power or ground solder balls (e.g., solder balls 420) may be coupled to conductive elements 180. It should also be appreciated that if solder balls 430 are coupled to test contacts 120 before solder balls 420 are coupled to conductive contacts 180, built-up charge may propagate into IC device 410 and may potentially damage circuitry within IC device 410.

FIG. 4C illustrates IC device 410 with solder balls 420 and 430 being coupled respectively to test contacts 110 and 120. IC device 410 may be pressed down into test contactor 100 and springs 140 may be compressed until test contacts 110 and 120 are coupled to solder balls 420 and 430, respectively. It should be appreciated that springs 140 may dampen the motion of IC device 410 as device 410 is inserted into the cavity of test contactor 100. Solder balls 420 and 430 of IC device 410 may rest on test contacts 110 and 120, respectively, as illustrated in FIG. 4C. In one embodiment, if test contacts 110 and 120 are pogo pins, test contacts 110 and 120 may be compressed when IC device 410 is pushed onto test contacts 110 and 120. Device 410 be then be tested in the compressed state of FIG. 4C.

FIG. 5, meant to be illustrative and not limiting, shows top-down view 500 of an integrated circuit (IC) with a plurality of solder balls 420 and 430 that are coupled to a test contactor in accordance with one embodiment of present invention. In one embodiment, top-down view 500 shows solder balls 420 coupled to conductive contacts 180. In the exemplary embodiment of FIG. 5, at least a subset of the circular apertures may have a pair of opposing conductive contacts 180. As shown in FIG. 5, solder balls 420 may be sandwiched or placed in between each pair of opposing contacts 180. Solder balls 420 for conveying power supply signals (e.g., ground power supply voltage) may be coupled to ground via contacts 180, whereas solder balls 430 for conveying signals may not be coupled to conductive contacts 180.

Figure 6:
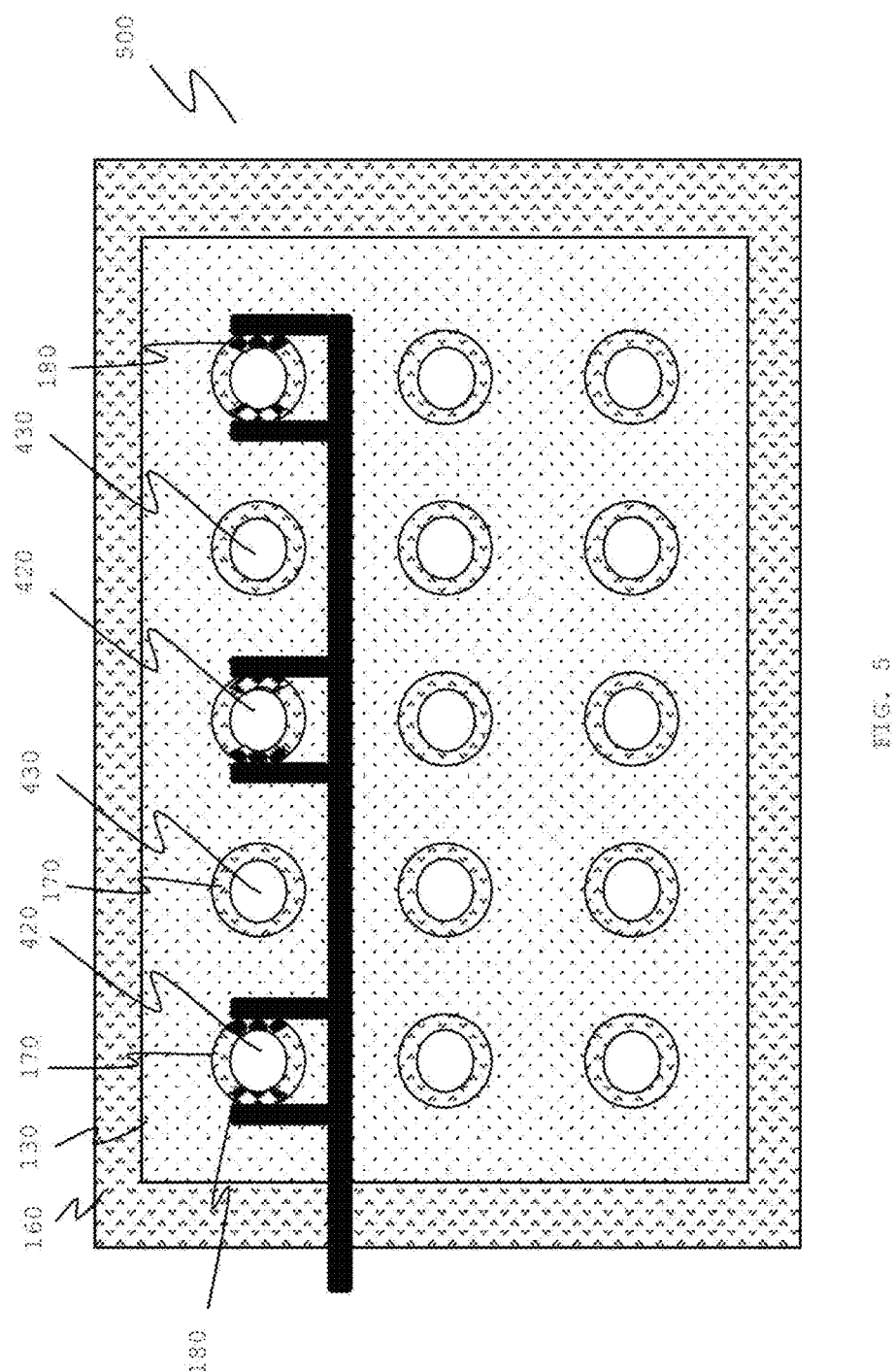
FIG. 6 is a flow chart of illustrative steps for testing an integrated circuit with a test contactor in accordance with one embodiment of the present invention.
Figure 6:
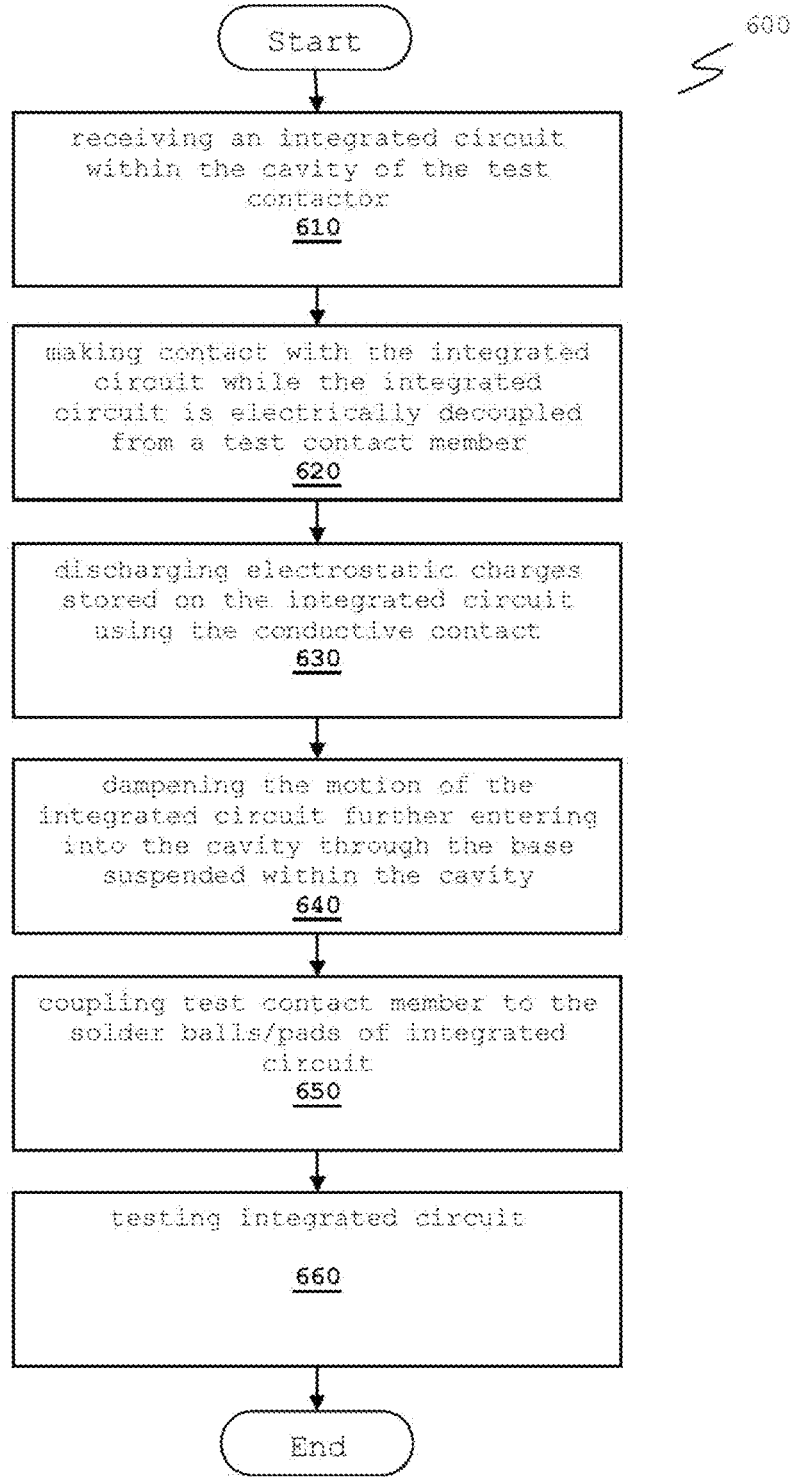

FIG. 6, meant to be illustrative and not limiting, shows method 600 for testing an integrated circuit with a test contactor in accordance with an embodiment of the present invention. In one embodiment, the test contactor may be similar to test contactor 100 of FIG. 1. At step 610, the test contactor may begin receiving an integrated circuit within its cavity. At step 620, the test contactor makes its first electrical contact with the integrated circuit. The first electrical contact may be established through conductive contacts 180 on the test contactor (e.g., solder balls on the integrated circuit may make contact with aperture grounding contacts 180). However, at step 620, the integrated circuit may still be electrically decoupled from the test contact members on the test contactor. In one embodiment, the test contact members are test contacts 110 and 120, as illustrated in FIG. 1. The position of the IC with respect to the test contactor at step 620 may be similar to the arrangement as shown in FIG. 4B.

At step 630, electrostatic charge that has been accumulated on the IC may be discharged through the conductive contacts. In one embodiment, the electrostatic charge may be discharged to ground through the conductive contacts and an electrical pathway (e.g., electrical pathway 150 of FIG. 1).

At step 640, further motion of IC entering the cavity is dampened using the base suspended in the cavity. In one embodiment, the base may be similar to base 130 of FIG. 1 and may be suspended by springs 140. At step 650, the test contact members on the test contactor may be coupled to the solder balls or bump pads on the IC. The embodiment of FIG. 4C shows test contacts 110 and 120 of test contactor 100 coupled, respectively, to solder bumps 420 and 430 on IC device 410. It should be appreciated that ground solder balls/pads may be coupled to ground test contact members and the conductive contacts and signal solder balls/pads may be coupled to I/O test contact members. At step 660, the IC may be tested.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. A test structure operable to receive an integrated circuit, comprising:
   a substrate having a planar surface;
   a test contact member having a tip that extends from the planar surface of the substrate; and
   a base structure that is suspended above the planar surface, wherein the base comprises:
   an aperture within which the test contact member is positioned; and
   a conductive contact member formed within the aperture, wherein the conductive contact member is positioned further away from the planar surface of the substrate than the tip of the test contact member.

2. The test structure in claim 1, wherein the conductive contact member is coupled to a power supply terminal.

3. The test structure in claim 2, wherein the conductive contact member is operable to discharge electrostatic charge stored in the integrated circuit to the ground terminal when the conductive contact member contacts the integrated circuit.

4. The test structure in claim 1, wherein the test contact member is coupled to a power supply terminal.

5. The test structure in claim 1 further comprising:
   an additional test contact member that extends from the planar surface of the substrate, wherein the additional test contact member is operable to convey data signals, and wherein the base structure further comprises another aperture within which the additional test contact member is positioned.

6. The test structure in claim 1, wherein the aperture in the base comprises a circular through hole.

7. The test structure in claim 1, wherein the test contact member comprises a pogo pin.

8. The test structure in claim 1, further comprising:
   a spring that suspends the base structure above the planar surface of the substrate.

9. A test contactor operable to receive an integrated circuit under test, comprising:
   a substrate having a surface;
   a test contact member that protrudes from the surface; and
   a base having a hole surrounding the test contact member, wherein the base includes a conductive contact member formed at a peripheral edge of the hole, and wherein the integrated circuit under test makes contact with the conductive contact member before making contact with the test contact member when being received by the test contactor.

10. The test contactor in claim 9, wherein the conductive contact member is operable to discharge electrostatic charge on the integrated circuit to ground.

11. The test contactor in claim 9, wherein the test contact member is partially embedded in the substrate.

12. The test contactor in claim 9 further comprising:
   a plurality of springs interposed between the base and the surface of the substrate.

13. The test contactor in claim 9, wherein the hole has a shape selected from the group consisting of: a circle, a rectangle, and a triangle.

14. The test contactor in claim 13, wherein the hole having a width greater than 0.2 millimeter.

15. A test system, comprising:
   an integrated circuit having a input-output contact operable to convey a power supply voltage; and
   a test socket for receiving the integrated circuit, comprising:
      a substrate having a surface;
      a test contact member that protrudes from the surface of the substrate by a first distance; and
      a base structure suspended over the surface of the substrate by a second distance that is larger than the first distance, wherein the base has a through hole that surrounds the test contact member.

16. The test system in claim 15, wherein the integrated circuit further comprises an additional input-output contact operable to convey data signals, and wherein the test socket further comprises:
   an additional test contact member that protrudes from the surface of the substrate, wherein the additional test contact member is configured to make contact with the additional input-output contact; and
   an additional through-hole within which the additional test contact member is positioned.

17. The test system in claim 16, wherein the test contact member and the additional test contact member comprise pogo pins.

18. The test system in claim 15, wherein the test contact member is coupled to a ground terminal.

19. The test system in claim 15, wherein the test socket further comprises:
   a conductive contact member that at least partially surrounds an edge of the through hole.

20. The test system in claim 15, wherein the test socket further comprises:
   a plurality of springs that suspends the base structure above the substrate.

21. A method for testing an integrated circuit using a test contactor that includes a substrate, a test contact member formed in the substrate, and a base suspended above the test contact member, wherein the base has a hole, the method comprising:
   receiving the integrated circuit on the base of the test contactor; and
   with a conductive contact formed in the hole of the base, making contact with the integrated circuit while the integrated circuit is electrically decoupled from the test contact member.

22. The method of testing in claim 21, further comprising:
   coupling the conductive contact to an input-output pad of the integrated circuit to form a electrostatic discharge path.

23. The method of testing in claim 21, wherein a plurality of springs is interposed between the substrate and the base, the method further comprising:
   compressing the plurality of springs while the integrated is being received on the base.

24. The method in claim 21, further comprising:
   discharging electrostatic charge stored on the integrated circuit using the conductive contact.

25. The method defined in claim 21, wherein the test contact member comprises one test contact member in a plurality of test contact member formed in the substrate, wherein the hole comprises one hole in a plurality of holes formed in the base, wherein only a subset of holes in the plurality of holes includes conductive contacts, and wherein making contact with the integrated circuit comprises using the conductive contacts in the subset of holes to make contact with the integrated circuit while the integrated circuit is electrically decoupled from the plurality of test contact members.

\* \* \* \* \*